(12) United States Patent
Kijima

(10) Patent No.: US 6,282,077 B1
(45) Date of Patent: Aug. 28, 2001

(54) CERAMIC CAPACITOR MOUNTING STRUCTURE

(75) Inventor: Kenji Kijima, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/366,537

(22) Filed: Aug. 4, 1999

(30) Foreign Application Priority Data

Aug. 4, 1998  (JP) .................................................. 10-220303

(51) Int. Cl.[7] ...................................................... H01G 4/35
(52) U.S. Cl. .................... 361/302; 361/306.1; 361/306.3
(58) Field of Search ..................................... 361/302, 303, 361/306.1, 321.2, 306.3

(56) References Cited

U.S. PATENT DOCUMENTS 5,531,003 * 7/1996 Seifried et al. ...................... 29/25.42
5,999,398 * 12/1999 Makl et al. ............................ 361/302

* cited by examiner

Primary Examiner—Anthony Dinkins
(74) Attorney, Agent, or Firm—Foley & Lardner

(57) ABSTRACT

A ceramic capacitor mounting structure includes a flat capacitor element and two electrodes. The two electrodes are connected respectively between opposite surfaces of the capacitor element and have extensions which extend outwards from the periphery of the capacitor element. The ceramic capacitor mounting structure is structured in such a manner that by virtue of the electrode extensions it is capable of being connected to and released from connectors which are connected to bus bars or similar elements.

2 Claims, 5 Drawing Sheets

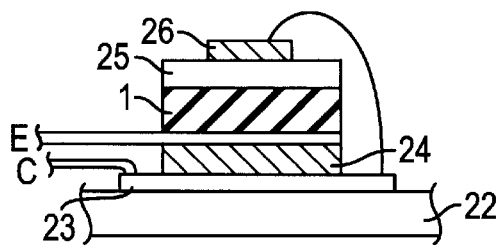
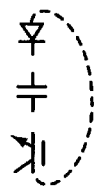
FIG. 11A  FIG. 11B
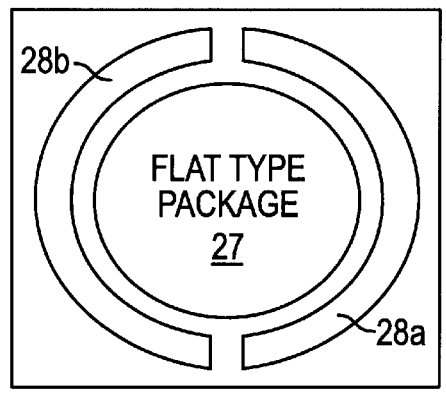
FIG. 12A
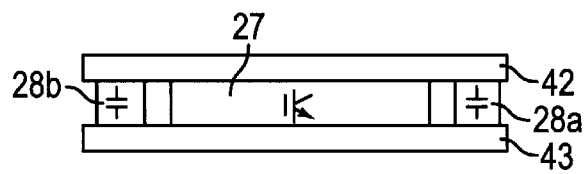
FIG. 12B
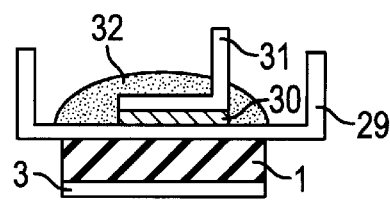
FIG. 13

CERAMIC CAPACITOR MOUNTING STRUCTURE

BACKGROUND OF THE INVENTION

1. Field of the Invention

The present invention relates to a mounting structure for a non-polar inorganic ceramic capacitor having a steatite, titanium, barium titanate, strontium or similar ceramic as a dielectric material on to which electrodes are directly printed.

2. Description of the Related Art

Examples of conventional ceramic capacitors of this sort include the flat type illustrated in FIG. 1, and the block type illustrated in FIG. 2. Flat-type ceramic capacitor comprises a flat capacitor element 1 and flat electrodes 2a and 3a attached to the upper and lower surfaces thereof. The object of the electrodes 2a and 3a is both to cool the capacitor element 1 and to provide conductivity.

Block-type ceramic capacitor comprises a block-shaped capacitor element 4, and L-shaped electrodes 5, 6 which are attached to the bottom of the capacitor element 4 and connected electrically thereto. The object of the L-shaped electrodes 5, 6 is simply to provide conductivity.

Conventional ceramic capacitors as described above are characterized by high dielectric constant (permittivity), and can thus be rendered compact, while the fact that the capacitor element is inorganic brings the added advantage of relative absence of functional deterioration.

However, it is a common requirement according to application, as for instance in a power converter, that it be possible to lower the impedance in the wiring route connecting the ceramic capacitor and other electronic components.

SUMMARY OF THE INVENTION

Accordingly, one object of the present invention is to provide a novel ceramic capacitor mounting structure wherein it is possible to lower the impedance in the wiring routes connecting the ceramic capacitor and other electronic components, while at the same achieving an excellent cooling effect.

With a view to attaining the aforesaid object, the present invention is a ceramic capacitor mounting structure comprising a flat capacitor element, and first and second electrodes connected to an opposite surface of the capacitor element respectively, and having extension member which extend outward from the periphery of the capacitor element respectively; and first and second connectors attachable to the extension member of the first and second electrodes respectively.

By virtue of the present invention, impedance in the wiring route between the capacitor element and the bus bars is reduced, while the extensions to the electrodes act as a radiation fin, thus improving the cooling effect.

With a view to attaining the aforesaid object, the present invention is a ceramic capacitor mounting structure comprising a ceramic capacitor comprising:

a flat capacitor element;

a first and second electrodes connected respectively to opposite surfaces of the capacitor element; wherein the ceramic capacitor is located between direct-current terminals of an inveter designed to permit a two-level alternating-current output; and the direct-current terminals and the first and second electrodes being connected electrically and mechanically.

The fact that by virtue of the present invention the direct-current terminals and the electrodes of the capacitor are directly connected in this manner contributes to achieving lower impedance.

With a view to attaining the aforesaid object, the present invention is a ceramic capacitor mounting structure comprising a ceramic capacitor comprising:

a flat capacitor element;

a first and second electrodes connected respectively to opposite surfaces of the capacitor element; wherein two ceramic capacitors are respectively located between a neutral terminal and direct-current terminals of an inverter to permit a three-level alternating-current output; and the neutral terminal and the first and second electrodes being each connected electrically and mechanically.

The fact that by virtue of the present invention the direct-current terminal and the neutral terminal are directly connected in this manner to the electrodes of the first capacitor, while the neutral terminal and the direct-current terminal are directly connected to the electrodes of the second capacitor contributes to achieving lower impedance.

With a view to attaining the aforesaid object, the present invention is a ceramic capacitor mounting structure comprising a flat capacitor element; a single electrode connected electrically to one surface of the capacitor element; an electrode body connected electrically to the other surface of the capacitor element; and a coolant passage structuring member fashioned integrally with the electrode body and carrying a coolant to facilitate the cooling of the electrode body.

By virtue of the present invention the upper electrode is cooled in this manner, as is the capacitor element, a configuration which contributes to rendering the structure more compact.

With a view to attaining the aforesaid object, the present invention is a ceramic capacitor mounting structure comprising a flat capacitor element; a single electrode connected electrically to one surface of the capacitor element; an electrode body connected electrically to the other surface of the capacitor element; and a cooling fin fashioned integrally with the electrode body and serving to increase the radiation effect.

By virtue of the present invention the upper electrode is cooled in this manner by the cooling fin, as is the capacitor element, a configuration which contributes to rendering the structure more compact.

With a view to attaining the aforesaid object, the present invention is a ceramic capacitor mounting structure comprising a plurality of ceramic capacitors comprising a flat capacitor element and two electrodes each connected electrically to opposite surfaces of the capacitor element, wherein the ceramic capacitors are located between two flexible bus bars, and the electrodes are connected electrically and mechanically to the flexible bus bars respectively.

The fact that by virtue of the present invention a plurality of ceramic capacitors is connected parallelly in this manner with the aid of the flexible bus bars contributes to achieving lower impedance because it allows the wiring route to be shortened in comparison with a conventionally-wired parallel connection.

With a view to attaining the aforesaid object, the present invention is a ceramic capacitor mounting structure comprising a single ceramic capacitor which comprises a flat capacitor element and a electrode connected electrically to one surface of the capacitor element;

a single semiconductor power element which comprises a semiconductor power element chip mounted on and connected electrically to a substrate with a pattern wiring;

wherein the ceramic capacitor and the semiconductor power element are connected electrically in parallel, and a wiring for use in external connection being located between the other surface of the capacitor element and the other surface of the chip, the capacitor element and the chip being connected electrically and mechanically.

By virtue of the present invention this configuration contributes to achieving lower impedance because it allows the wiring route between the capacitor element and the semiconductor power element chip to be shortened.

With a view to attaining the aforesaid object, the present invention is a ceramic capacitor mounting structure wherein a snubber circuit comprising a serially connected diode and capacitor is connected electrically to a single semiconductor power element in parallel fashion; the ceramic capacitor comprising a flat capacitor element and a single electrode connected electrically to one surface of the capacitor element; the diode comprising a substrate with a wiring pattern, and diode chip mounted on and electrically connected to the substrate; and the surface of the capacitor element to which no electrode is connected, and the wiring pattern on the surface of the substrate on which no diode chip is mounted are connected electrically.

The fact that by virtue of the present invention the capacitor element and DBC (that is to say, Direct Bonding Copper) substrate with the diode chip mounted thereon are directly connected electrically and mechanically in this manner contributes to achieving lower impedance because it allows the wiring route between the serial circuit comprising the capacitor element and diode chip on the one hand and the power element chip on the other hand to be shortened.

With a view to attaining the aforesaid object, the present invention is a ceramic capacitor mounting structure comprising a semiconductor power element which comprises a semiconductor power element chip which mounted on a substrate with a wiring pattern, has electrically connected thereto for use in external connection an emitter and a collector terminal;

a ceramic capacitor which comprises a flat capacitor element;

a diode comprising a substrate with a wiring pattern and diode chip mounted on and electrically connected to the substrate;

wherein the semiconductor power element, the ceramic capacitor and the diode are serially connected; and one surface of the capacitor element is connected electrically to a surface of an emitter terminal of the semiconductor power element, and the other surface of the capacitor element and the wiring pattern of the substrate on which the diode chip is mounted are connected electrically.

The fact that by virtue of the present invention the semiconductor power element chip with the emitter is connected directly to the capacitor element in this manner, as is also the wiring pattern of the DBC substrate with the diode chip mounted thereon, contributes to achieving lower impedance. A power converter configured after this fashion is very effective in lowering impedance.

With a view to attaining the aforesaid object, the present invention is a ceramic capacitor mounting structure comprising a single semiconductor power element; a plurality of ceramic capacitors; and first and second substrates with wiring patterns; wherein the semiconductor power element is located between the first and second substrates, and has a chip housed within a circular package, and emitter, collector and gate terminals which are connected electrically to the chip and led outside the package, while also being connected electrically to the wiring patterns on the first and second substrates; and the ceramic capacitor is located between the first and second substrates on the periphery of the circular package of the semiconductor power element, the circular capacitor element being divided radially, while the divided capacitor elements are connected electrically to the wiring patterns on the first and second substrates.

By virtue of the present invention this sort of configuration makes it possible to achieve lower impedance and greater compactness.

With a view to attaining the aforesaid object, the present invention is a ceramic capacitor mounting structure wherein a snubber circuit comprising a serially connected ceramic capacitor and diode is connected electrically in parallel fashion to a single semiconductor power element; the ceramic capacitor comprising a flat capacitor element and an electrode, which forms one surface of this capacitor element whereto it is connected electrically; the diode having a diode chip, in addition to a cathode and an anode which are connected electrically to the diode chip and further act as cooling fins; and either the cathode terminal or the anode terminal of the diode is connected electrically and mechanically to the opposite surface of the capacitor element from the electrode to constitute a moulded layer wherein the periphery of the diode chip is embedded in such a manner that the cathode and anode terminals are exposed.

The fact that by virtue of the present invention the periphery of the diode chip is embedded in the moulded layer in this manner contributes to improving insulation performance around the chip, and helps to render the structure more compact.

With a view to attaining the aforesaid object, the present invention is a ceramic capacitor mounting structure comprising a semiconductor power element chip constituting a power converter, or a snubber diode chip, or both these; and a ceramic capacitor, wherein the ceramic capacitor comprises a flat capacitor element, first and second electrodes connected electrically and mechanically to opposite surfaces of the capacitor element, and first and second plugs respectively connected electrically and mechanically to the electrodes; and the semiconductor power element or snubber diode is equipped with a package, a chip housed within this package, and terminals comprising an emitter, collector and gate, or a cathode and an anode, while receptacles provided within the package and connected electrically to the terminals are capable of being connected to and released from the plugs in the ceramic capacitor.

The fact that by virtue of the present invention the capacitor element and either the semiconductor power element chip, the snubber diode chip, or both are connected in this manner by way of the plugs and the receptacles makes it possible to achieve lower impedance and greater compactness.

With a view to attaining the aforesaid object, the present invention is a ceramic capacitor mounting structure wherein a single ceramic capacitor is connected between first and second direct-current terminals in an inverter designed to permit a two-level alternating-current output; the ceramic capacitor comprising a block-shaped capacitor element and L-shaped first and second electrodes each connected electrically to one surface of the capacitor element; and an insulating body is located between the direct-current terminals, while apertures are formed which penetrate the insulating body and the direct-current terminals, an insulating layer being formed around the aperture in the first direct-current terminal, and a conductive pin being inserted through the aperture formed in the insulating layer, the aperture in the insulating body and the aperture in the second direct-current terminal, serving respectively to fix the second electrode of the capacitor electrically to the second direct-current terminal, and to fix the first electrode of the capacitor electrically directly to the first direct-current terminal.

The fact that by virtue of the present invention the electrode is connected directly to the first direct-current terminal, while the electrode is connected electrically to the second direct-current terminal immediately below this contributes to lowering impedance.

With a view to attaining the aforesaid object, the present invention is a ceramic capacitor mounting structure wherein two ceramic capacitors are connected between first and second direct-current terminals and a neutral terminal in an inverter designed to permit a three-level alternating-current output; the first and second ceramic capacitors comprising block-shaped capacitor elements and L-shaped first and second electrodes each connected electrically to one surface of the capacitor elements; and first and second insulating bodies are located respectively between the first direct-current terminal and the neutral terminal, and between the second direct-current terminal and the neutral terminal, while apertures are formed which penetrate respectively the first and second insulating bodies, the first and second direct-current terminals, and the neutral terminal, insulating layers being formed around the apertures in the first and second direct-current terminals respectively, and conductive pins being inserted respectively through the apertures formed in the insulating layers, the apertures in the first and second insulating bodies, and the aperture in the neutral terminal, serving respectively to fix the second electrodes of the first and second ceramic capacitors electrically to the neutral terminal, and to fix the first electrodes of the first and second ceramic capacitors electrically directly to the direct-current terminals.

The fact that by virtue of the present invention the electrode of the first ceramic capacitor is connected directly in this manner to the direct-current terminal, the second electrode of the first ceramic capacitor being connected electrically to the neutral terminal immediately below this, while the electrode of the second ceramic capacitor is connected directly to the direct-current terminal, the second electrode of the second ceramic capacitor being connected electrically to the neutral terminal immediately below this contributes to lowering impedance.

BRIEF DESCRIPTION OF THE DRAWINGS

A more complete appreciation of the present invention and many of the attendant advantages thereof will readily be obtained as the same becomes better understood by reference to the following detailed description when considered in connection with the accompanying drawings, wherein:

FIG. 11 is a drawing for describing a ninth embodiment of the ceramic capacitor to which the present invention pertains;

FIGS. 12(a) and 12(b) are drawings for describing a tenth embodiment of the ceramic capacitor to which the present invention pertains;

FIG. 13 is a drawing for describing an eleventh embodiment of the ceramic capacitor to which the present invention pertains;

DETAILED DESCRIPTION OF THE PREFERRED EMBODIMENTS

Figure 1:
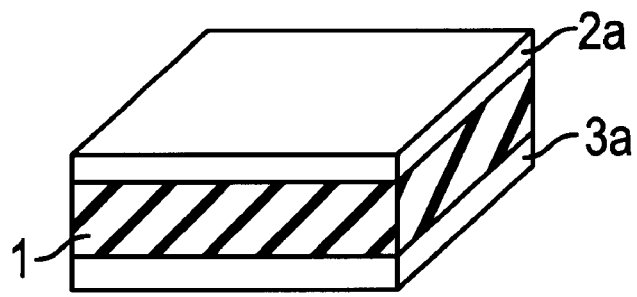
FIG. 1 is an oblique view illustrating an example of a conventional flat-type ceramic capacitor.
Figure 2:
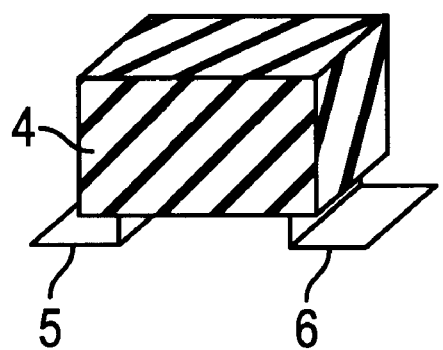
FIG. 2 is an oblique view illustrating an example of a conventional block-type ceramic capacitor.

With reference now to the drawings, wherein like reference numerals designate identical or corresponding parts throughout the several views, and particularly to FIG. 3, a first embodiment of the present invention will be described.

<First Embodiment>

Figure 3:
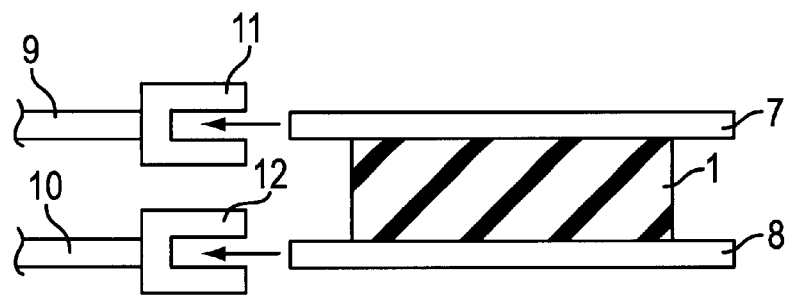
FIG. 3 is a drawing for describing a first embodiment of the ceramic capacitor to which the present invention pertains.

FIG. 3 is a drawing for describing a first embodiment of the present invention. To the upper and lower surfaces of a flat capacitor element 1 are connected electrodes 7, 8. These are also flat and greater in area than the capacitor element 1. The structure is such that connectors 11, 12 fitted to the leading ends of bus bars 9, 10 respectively can be connected to and released from the ends of the electrodes 7, 8.

In this manner the bus bars 9, 10 and electrodes 7, 8 are connected electrically by means of the connectors 11, 12, so that impedance in the wiring route between the capacitor element 1 and the bus bars 9, 10 can be reduced. Meanwhile, the fact that the periphery of the electrodes 7, 8 extends outwards from the capacitor element 1 allows that section to act as a radiation fin, thus improving the cooling effect.

<Second Embodiment>

Figure 4:
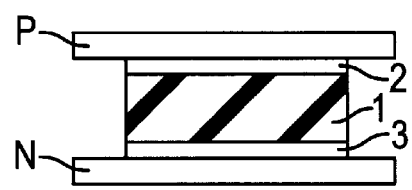
FIG 4 is a drawing for describing a second embodiment of the ceramic capacitor to which the present invention pertains.

FIG. 4 is a drawing for describing a second embodiment of the present invention. A ceramic capacitor comprising flat electrodes 2 and 3 connected to the upper and lower surfaces of a flat capacitor element 1 is inserted between the direct-current terminals P and N of an inverter designed to permit a two-level alternating-current output. The direct-current terminals P and N are connected electrically and mechanically directly to the respective electrodes 2 and 3 of the capacitor by soldering, screwing or similar means.

The fact that the direct-current terminals and the electrodes of the capacitor are directly connected in this manner contributes to achieving lower impedance.

<Third Embodiment>

Figure 5:
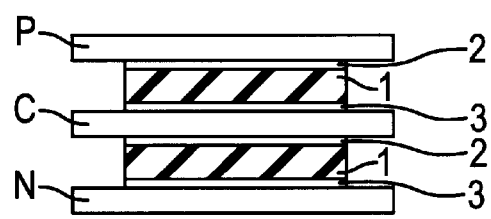
FIG. 5 is a drawing for describing a third embodiment of the ceramic capacitor to which the present invention pertains.

FIG. 5 is a drawing for describing a third embodiment of the present invention. Two ceramic capacitors comprising flat electrodes 2 and 3 connected to the upper and lower surfaces of flat capacitor elements 1 are prepared and inserted between the direct-current terminal P and a neutral terminal C, and between the neutral terminal C and the direct-current terminal N of an inverter designed to permit a three-level alternating-current output. The direct-current terminals P and N are connected electrically and mechanically directly to the respective electrodes 2 and 3 of the capacitor by soldering, screwing or similar means.

The fact that the direct-current terminal P and the neutral terminal C are directly connected in this manner to the electrodes 2 and 3 of the first capacitor, while the neutral terminal C and the direct-current terminal N are directly connected to the electrodes 2 and 3 of the second capacitor contributes to achieving lower impedance.

<Fourth Embodiment>

Figure 6:
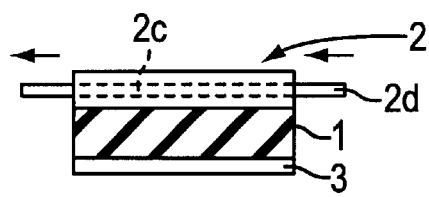
FIG. 6 is a drawing for describing a fourth embodiment of the ceramic capacitor to which the present invention pertains.

FIG. 6 is a drawing for describing a fourth embodiment of the present invention. One of the electrodes of a ceramic capacitor of the type illustrated in FIG. 4, for instance the upper electrode 2, is formed integrally of an electrode body 2c and a coolant passage structuring member 2d. The electrode body 2c possesses the original function of an electrode. Meanwhile, the coolant passage structuring member 2d, which may for instance be a cooling tube, is fashioned so as to pierce the electrode body 2c, carrying a coolant principally for the purpose of cooling the same.

In this manner the upper electrode 2 is cooled, as is the capacitor element 1, a configuration which contributes to rendering the structure more compact.

<Fifth Embodiment>

Figure 7:
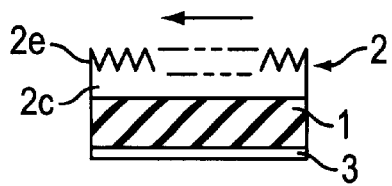
FIG. 7 is a drawing for describing a fifth embodiment of the ceramic capacitor to which the present invention pertains.

FIG. 7 is a drawing for describing a fifth embodiment of the present invention. One of the electrodes of a ceramic capacitor of the type illustrated in FIG. 4, for instance the upper electrode 2, is formed integrally of an electrode body 2c and a cooling fin 2e. The electrode body 2c possesses the original function of an electrode, while the cooling fin 2e is fashioned so as to increase the radiation area.

In this manner the upper electrode 2 is cooled by the cooling fin 2e, as is the capacitor element 1, a configuration which contributes to rendering the structure more compact.

<Sixth Embodiment>

Figure 8:
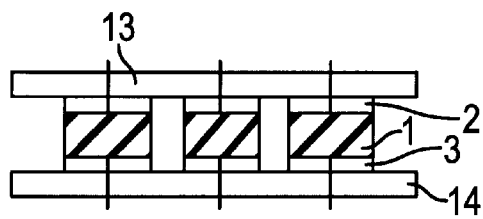
FIG. 8 is a drawing for describing a sixth embodiment of the ceramic capacitor to which the present invention pertains.

FIG. 8 is a drawing for describing a sixth embodiment of the present invention. A plurality of ceramic capacitors of the type illustrated in FIG. 4 is prepared, and these are inserted between flexible bus bars 13 and 14. The bus bars 13 and 14 are connected electrically and mechanically to the respective electrodes 2 and 3 by soldering, pressure clamping, screwing or similar means.

The fact that a plurality of ceramic capacitors is connected parallelly in this manner with the aid of the flexible bus bars 13 and 14 contributes to achieving lower impedance because it allows the wiring route to be shortened in comparison with a conventionally-wired parallel connection.

<Seventh Embodiment>

Figure 9A:
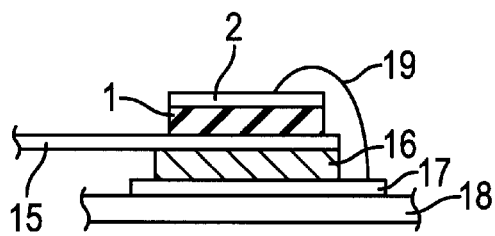
FIGS. 9(a) and (9b) are drawings for describing a seventh embodiment of the ceramic capacitor to which the present invention pertains.
Figure 9B:
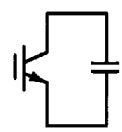

FIG. 9 is a drawing for describing a seventh embodiment of the present invention. Here, (a) illustrates the outline configuration, while (b) is a circuitry diagram. As may be seen from the circuitry diagram (b), the present embodiment involves directly joining a semiconductor power element (IGBT, IEGT or similar element) chip 16 constituting a power converter to a surge-absorption capacitor.

More specifically, an electrode 2 is connected to one surface of a capacitor element 1, the upper surface for instance, and a chip 16 is connected to the other surface of the capacitor element 1, there being located between them wiring 15 for use in external connection. The chip 16 is mounted on and connected to a DBC substrate 18 with a wiring pattern 17, while the wiring pattern 17 and electrode 2 are connected by wiring 19.

This configuration contributes to achieving lower impedance because it allows the wiring route between the capacitor element 1 and the semiconductor power element chip 16 to be shortened.

<Eighth Embodiment>

Figure 10A:
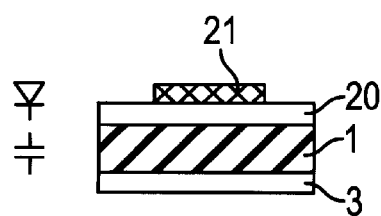
FIGS. 10(a) and 10(b) are drawings for describing an eighth embodiment of the ceramic capacitor to which the present invention pertains.
Figure 10B:
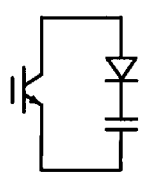

FIG. 10 is a drawing for describing an eighth embodiment of the present invention. Here, (a) illustrates the outline configuration, while (b) is a circuitry diagram. As may be seen from the circuitry diagram (b), the present embodiment involves the serial connection of a snubber circuit comprising a diode and capacitor to a semiconductor power element (IGBT, IEGT or similar element) chip 16 constituting a power converter.

More specifically, a ceramic capacitor is formed by joining a flat electrode 3 to the lower surface of a flat capacitor element 1, while a DBC substrate 20 with a diode chip 21 mounted thereon is connected electrically and mechanically to the other surface of the capacitor element 1.

The fact that the capacitor element 1 and DBC substrate 20 with the diode chip 21 mounted thereon are directly connected electrically and mechanically in this manner contributes to achieving lower impedance because it allows the wiring route between the serial circuit comprising the capacitor element 1 and diode chip 21 on the one hand and the power element chip on the other hand to be shortened.

<Ninth Embodiment>

FIG. 11 is a drawing for describing a ninth embodiment of the present invention. Here, (a) illustrates the outline configuration, while (b) is a circuitry diagram. As may be seen from the circuitry diagram (b), the present embodiment involves the serial connection of a snubber circuit comprising a diode and capacitor to a semiconductor power element (IGBT, IEGT or similar element) chip 16 constituting a power converter.

More specifically, a semiconductor power element chip 24 with an emitter E attached is mounted on and connected directly to the wiring pattern 23 of a DBC substrate 22, while a collector terminal C is also connected to the wiring pattern 23. At the same time, one surface of a flat capacitor element 1 to which no electrode is attached is connected electrically and mechanically to the emitter E, while a diode chip 26 is mounted on and connected to the wiring pattern of a DBC substrate 25, which in turn is connected directly to the other surface of the capacitor element 1.

This sort of structure is laminated on to each semiconductor power element chip 24, and a plurality of these are used to constitute a power converter.

The fact that the semiconductor power element chip 24 with the emitter E is connected directly to the capacitor element 1 in this manner, as is also the wiring pattern of the DBC substrate 25 with the diode chip 26 mounted thereon, contributes to achieving lower impedance. A power converter configured after this fashion is very effective in lowering impedance.

<Tenth Embodiment>

FIG. 12 is a drawing for describing a tenth embodiment of the present invention. FIG. 12(a) is a view from above which illustrates the outline configuration; while FIG. 12(b) is a cross-sectional representation. The present embodiment comprises a single semiconductor power element, a plurality of ceramic capacitors, and first and second substrates 42 and 43 with wiring patterns. More specifically, the semiconductor power element is located between the first and second substrates 42 and 43. It has a chip 27 housed within a circular package, and emitter, collector and gate terminals which are connected electrically to the chip 27 and led outside the package, while also being connected electrically to the wiring patterns (not shown in the drawings) on the first and second substrates 42 and 43.

The ceramic capacitor is located between the first and second substrates 42 and 43 on the periphery of the circular package 27 of the semiconductor power element. The circular capacitor element is, for example, divided radially into two hemispheres 28a and 28b. These hemispheres 28a and 28b are connected electrically to the wiring patterns on the first and second substrates 42 and 43.

This sort of configuration makes it possible to achieve lower impedance and greater compactness.

<Eleventh Embodiment>

FIG. 13 is a drawing for describing an eleventh embodiment of the present invention. A snubber circuit comprising a serially connected ceramic capacitor and diode is connected electrically in parallel fashion to a single semiconductor power element.

The ceramic capacitor comprises a flat capacitor element 1 and an electrode 3, which forms one surface of this capacitor element 1 whereto it is connected electrically. The diode has a diode chip 30, a cathode 29 which is connected electrically to the diode chip 30 and further acts as a cooling fin, and an anode 31 which also acts as a cooling fin. Either the cathode terminal or the anode terminal of the diode is connected electrically and mechanically to the opposite surface of the capacitor element 1 from the electrode to form a ceramic capacitor mounting structure comprising a moulded layer 32 of, for instance, epoxy resin wherein the periphery of the diode chip 30 is embedded in such a manner that the cathode and anode terminals are exposed.

The fact that the periphery of the diode chip 30 is embedded in the moulded layer 32 in this manner contributes to improving insulation performance around the chip 30, and helps to render the structure more compact.

<Twelfth Embodiment>

Figure 14:
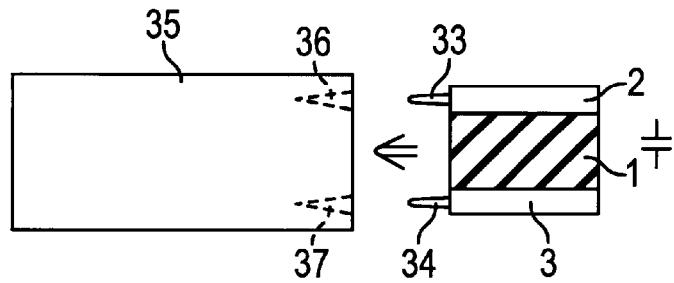
FIG. 14 is a drawing for describing a twelfth embodiment of the ceramic capacitor to which the present invention pertains.

FIG. 14 is a drawing for describing a twelfth embodiment of the present invention. A snubber capacitor having plugs 33 and 34 attached to the respective ends of electrodes 2 and 3, which are connected to the upper and lower surfaces of a flat capacitor element 1, is structured in such a manner as to be capable of being connected to and released from receptacles 36 and 37 formed in a package 35.

The package 35 houses a semiconductor power element chip, a snubber diode chip, or both these, while the chip or chips and the receptacles 36, 37 are connected electrically.

The fact that the capacitor element 1 and either the semiconductor power element chip, the snubber diode chip, or both are connected in this manner by way of the plugs 33 and 34 and the receptacles 36 and 37 makes it possible to achieve lower impedance and greater compactness.

<Thirteenth Embodiment>

Figure 15:
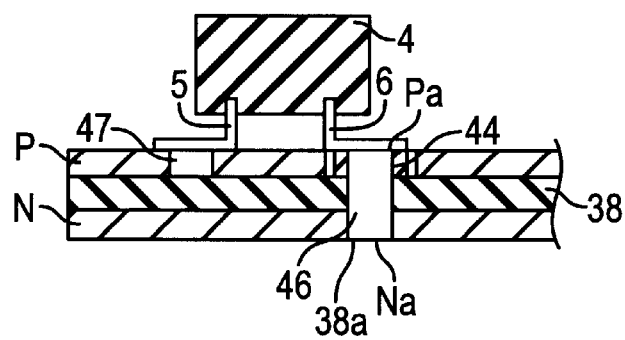
FIG. 15 is a drawing for describing a thirteenth embodiment of the ceramic capacitor to which the present invention pertains.

FIG. 15 is a drawing for describing a thirteenth embodiment of the present invention. It illustrates the principal parts where a block-type ceramic capacitor has been applied to an inverter designed to permit a two-level alternating-current output. More specifically, a single ceramic capacitor is connected between first and second direct-current terminals P and N. The ceramic capacitor comprises a block-shaped capacitor element 4 with L-shaped first and second electrodes 5 and 6 each connected electrically to one surface of the capacitor element 4.

An insulating body 38 is located between the direct-current terminals P and N, and apertures Pa and Na are formed which penetrate the insulating body 38 and the direct-current terminals P and N. Next, the ceramic capacitor is placed on the direct-current terminal P, and an insulating layer 44 is formed around the aperture Pa in the first direct-current terminal P. A conductive pin 46 is then inserted through the aperture formed in the insulating layer 44, the aperture 38a in the insulating body 38, and the aperture Na in the second direct-current terminal N. This conductive pin 46 serves by soldering or similar means to fix the second electrode 6 of the capacitor electrically to the second direct-current terminal N. A conductive pin 47 inserted in the same manner through the first direct-current terminal P serves by soldering or similar means to fix the first electrode 5 of the ceramic capacitor electrically directly to the direct-current terminal P. It should be added that the conductive pin 47 may be omitted, in which case the electrode 5 may be connected directly to the direct-current terminal P.

The fact that the electrode 5 is connected directly to the direct-current terminal P, while the electrode 6 is connected electrically to the direct-current terminal N immediately below this contributes to lowering impedance.

<Fourteenth Embodiment>

Figure 16:
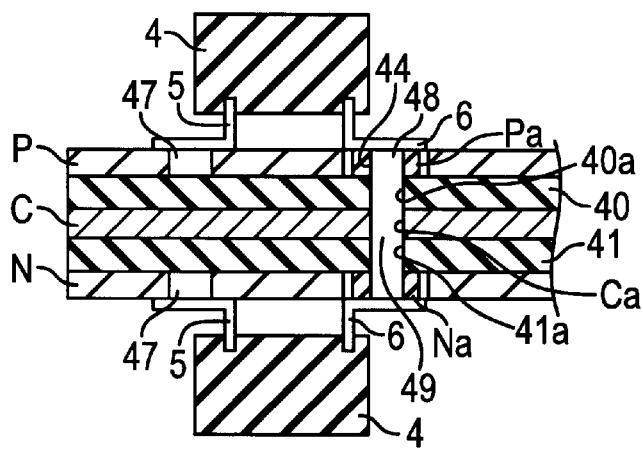
FIG. 16 is a drawing for describing a fourteenth embodiment of the ceramic capacitor to which the present invention pertains.

FIG. 16 is a drawing for describing a fourteenth embodiment of the present invention. It illustrates the principal parts where two block-type ceramic capacitors have been prepared and applied to an inverter designed to permit a three-level alternating-current output. More specifically, two ceramic capacitors are connected between first and second direct-current terminals P and N and a neutral terminal C.

The first and second ceramic capacitors comprise block-shaped capacitor elements 4 with L-shaped first and second electrodes 5 and 6 each connected electrically to one surface of the capacitor elements 4. First and second insulating bodies 40 and 41 are located respectively between the first direct-current terminal P and the neutral terminal C, and between the second direct-current terminal N and the neutral terminal C. Apertures 40a, 41a, Pa, Na and Ca are formed which penetrate respectively the insulating bodies 40 and 41, the first and second direct-current terminals P and N, and the neutral terminal C. Next, the first and second ceramic capacitors are placed respectively on the first direct-current terminal P and the second direct-current terminal N, and insulating layers 44 and 45 are formed around the apertures Pa and Na in the first and second direct-current terminals P and N respectively. Conductive pins 48 and 49 are then inserted respectively through the apertures formed in the insulating layers 44, 45, the apertures 40a and 41a in the insulating bodies 40 and 41, and the aperture Ca in the neutral terminal C. These conductive pins 48 and 49 each serve by soldering or similar means to fix the second electrode 6 of the second ceramic capacitor electrically to the neutral terminal C. Conductive pins 47 and 47 inserted in the same manner respectively through the first and second direct-current terminals P and N serve by soldering or similar means to fix the first electrodes 5 of the first and second ceramic capacitors electrically directly to the direct-current terminals P and N. It should be added that the conductive pin 47 may be omitted, in which case the electrode 5 may be connected directly to the direct-current terminal P.

The fact that the electrode 5 of the first ceramic capacitor is connected directly in this manner to the direct-current terminal P, the second electrode 6 of the first ceramic capacitor being connected electrically to the neutral terminal C immediately below this, while the electrode 5 of the second ceramic capacitor is connected directly to the direct-current terminal N, the second electrode 6 of the second ceramic capacitor being connected electrically to the neutral terminal C immediately below this contributes to lowering impedance.

<Modification>

In the preceding embodiments it is possible to employ either soldering, pressure clamping or screwing as a method of mounting the electrodes and capacitor elements. In this case it is preferable for the electrodes to be flexible.

The present invention provides a novel ceramic capacitor mounting structure wherein it is possible to lower the impedance in the wiring routes connecting the ceramic capacitor and other electronic components, while at the same time achieving an excellent cooling effect.

Obviously, numerous additional modifications and variations to the present invention are possible in the light of the above teachings. It is therefore to be understood that within the scope of the appended claims the present invention may be practised otherwise than as specifically described herein.

What is claimed is:

1. A ceramic capacitor mounting structure, comprising:

an inverter designed to permit to a two-level alternating-current output;

a ceramic capacitor respectively connected to first and second terminals of said inverter;

said ceramic capacitor comprising a block-shaped capacitor element and L-shaped first and second electrodes each connected electrically to a surface of said capacitor element;

an insulating body being located between first and second direct-current terminals, while apertures being formed to penetrate said insulating body and said first and second direct-current terminals, an insulating layer being formed around said aperture in said first direct-current terminal;

a first conductive pin being inserted through said apertures formed in said first direct-current terminal, said insulating body and said second direct-current terminal, serving to fix said second electrode of said capacitor electrically to said second direct-current terminal; and a second conductive pin serving to fix said first electrode of said capacitor electrically directly to said first direct current terminal.

2. A ceramic capacitor mounting structure, comprising:

an inverter designed to permit to a three-level alternating-current output;

ceramic capacitors respectively connected to first and second direct-current terminals and a neutral terminal of said inverter;

each of said ceramic capacitors comprising a block-shaped capacitor element and L-shaped first and second electrodes each connected electrically to one surface of said capacitor elements;

first and second insulating bodies being located respectively between said first direct-current terminal and said neutral terminal and between said second direct-current terminal and said neutral terminal, while apertures being formed which penetrate respectively said first and second insulating bodies, said first and second direct-current terminals, and said neutral terminal, insulating layers being formed around the apertures in said first and second direct-current terminals respectively;

first and second conductive pins being inserted respectively through said apertures formed in said first and second direct-current terminals, said first and second insulating bodies, and said neutral terminal, serving respectively to fix said second electrodes of said first and second ceramic capacitors electrically to the neutral terminal; and third and fourth conductive pins serving respectively to fix the first electrodes of said first and second ceramic capacitors electrically directly to said first and second direct-current terminals.

* * * * *